United States Patent
Jin et al.

(10) Patent No.: US 11,988,714 B2
(45) Date of Patent: May 21, 2024

(54) GAS DENSITY RELAY VERIFICATION DEVICE AND VERIFICATION METHOD THEREFOR

(71) Applicant: SHANGHAI ROYE ELECTRIC CO., LTD., Shanghai (CN)

(72) Inventors: Haiyong Jin, Shanghai (CN); Yehong Wu, Shanghai (CN); Xiaobeng Huang, Shanghai (CN); Wei Zeng, Shanghai (CN); Caixia Hao, Shanghai (CN); Lele Wang, Shanghai (CN)

(73) Assignee: Shanghai Roye Electric Co., Ltd., Shanghai (CN)

( * ) Notice: Subject to any disclaimer, the term of this patent is extended or adjusted under 35 U.S.C. 154(b) by 231 days.

(21) Appl. No.: 17/640,781

(22) PCT Filed: Aug. 26, 2020

(86) PCT No.: PCT/CN2020/111249
§ 371 (c)(1),
(2) Date: Mar. 4, 2022

(87) PCT Pub. No.: WO2021/043037
PCT Pub. Date: Mar. 11, 2021

(65) Prior Publication Data
US 2022/0334183 A1 Oct. 20, 2022

(30) Foreign Application Priority Data
Sep. 4, 2019 (CN) .......................... 201910830149.5

(51) Int. Cl.
*G01R 31/327* (2006.01)
(52) U.S. Cl.
CPC ................................ *G01R 31/3278* (2013.01)

(58) Field of Classification Search
CPC ............ G01R 31/3278; G01R 31/3271; G01R 31/327; H01H 33/563; H01H 35/28; G01N 9/26; G01N 9/00; G01D 21/02
(Continued)

(56) References Cited

U.S. PATENT DOCUMENTS

| | | | |
|---|---|---|---|
| 3,749,865 A | 7/1973 | Kalt et al. | |
| 2022/0334184 A1* | 10/2022 | Chang ................ | G01R 31/3278 |

(Continued)

FOREIGN PATENT DOCUMENTS

| | | |
|---|---|---|
| CN | 201004041 | 1/2008 |
| CN | 201034901 Y | 3/2008 |

(Continued)

*Primary Examiner* — Giovanni Astacio-Oquendo
(74) *Attorney, Agent, or Firm* — Hsuanyeh Law Group, PC

(57) ABSTRACT

A gas density relay check device and a check method thereof are provided. In check, a temperature adjusting mechanism and a gas density relay are relatively set. Temperature rise and fall of a temperature compensation element of the gas density relay is adjusted through the temperature adjusting mechanism, then the gas density relay is enabled to have a contact signal action. A gas density value is obtained according to the pressure value and the temperature value in the contact action. A contact signal operating value of the gas density relay is detected to check on the contact signal operating value of the gas density relay. The gas density relay check device of the present disclosure is capable of accurately checking gas density relays, and is particularly applicable to a gas density relay without a three-way valve, and check can be achieved without disassembling the gas density relay.

17 Claims, 2 Drawing Sheets

(58) Field of Classification Search
USPC .................... 324/418, 415, 422, 423, 421
See application file for complete search history.

(56) References Cited

U.S. PATENT DOCUMENTS

| | | | | |
|---|---|---|---|---|
| 2022/0336171 A1* | 10/2022 | Jin | ............................ | G01N 9/26 |
| 2022/0341993 A1* | 10/2022 | Xia | ........................ | H01H 35/26 |
| 2022/0390518 A1* | 12/2022 | Chang | .................... | G01D 21/02 |
| 2023/0168302 A1* | 6/2023 | Huang | .................. | G01N 9/266 |
| | | | | 324/415 |
| 2023/0221370 A1* | 7/2023 | Jin | ........................ | H01H 35/28 |
| | | | | 324/418 |

FOREIGN PATENT DOCUMENTS

| CN | 202512209 | 10/2012 |
|---|---|---|
| CN | 102879733 | 1/2013 |
| CN | 104698371 | 6/2015 |
| CN | 108226768 | 6/2018 |
| CN | 110412460 | 11/2019 |
| CN | 210923905 | 7/2020 |

* cited by examiner

GAS DENSITY RELAY VERIFICATION DEVICE AND VERIFICATION METHOD THEREFOR

CROSS-REFERENCE TO RELATED APPLICATIONS

The present application claims the priority of the Chinese patent application (name of invention: gas density relay check device and check method thereof) applied on Sep. 4, 2019, with the application No.: 201910830149.5.

TECHNICAL FIELD

The present invention relates to check equipment of an electronic instrument, and in particular to a gas density relay check device for checking a gas density relay and a check method thereof.

BACKGROUND

An $SF_6$ electrical product has been widely applied to power sectors and industrial and mining enterprises, promoting rapid development of the power industry. How to ensure reliable and safe operation of $SF_6$ electrical products has become one of important tasks of the power sectors. An $SF_6$ gas density relay is one of key elements of an $SF_6$ electrical switch, and is used to detect change of $SF_6$ gas densities in the body of $SF_6$ electrical equipment, and the performance thereof directly affects reliable and safe operation of the $SF_6$ electrical equipment. An $SF_6$ gas density relay installed in a field, because of infrequent operation, often has phenomena such as inflexibility or poor contact at a contact after a period of time, some even have degraded temperature compensation, and thus the $SF_6$ gas density relay is liable to have false actions when the ambient temperature changes. Therefore, the $SF_6$ gas density relay should be checked at regular time. Viewing from the actual operation, regular check on the $SF_6$ gas density relay in the field is one of necessary means to prevent problems and to ensure safe and reliable operation of power equipment. To check a density relay, a density relay check device (or called density relay check instrument) is needed. However, a commercially available density relay check device (or called density relay check instrument) has the working principle that the density relay has a contact action by adjusting the gas pressure thereof, and a gas density value is obtained according to a pressure value and a temperature value in the contact action, and a contact signal action value of the gas density relay is detected, to complete check on the contact signal operating value of the gas density relay. Whereas, density relays are mostly installed in the field, and no valve is installed between these density relays and electrical equipment thereof, so that the density relay cannot have the contact action by adjusting the gas pressure thereof. At present, one of solving ways is to additionally install a density relay check valve, however, additional installation is impossible for most equipment; in many situations, additional installation of the density relay check valve leads to degradation of seismic performance of the density relay; and in addition, a large amount of money is required. A second solving way is to disassemble the density relay to be checked, which may result in serious gas leakage caused by improper operation.

In conclusion, a check device and a check method for checking the gas density relay without installing the valve between the density relay and the electrical equipment thereof and disassembling the gas density relay are not available yet at present.

Therefore, it is urgent to develop a check device and a check method thereof for checking the gas density relay without adding the valve between the density relay and the electrical equipment thereof and disassembling the gas density relay.

SUMMARY

The object of the present invention is to provide a gas density relay check device (or called density relay check instrument) and a check method thereof, to solve problems mentioned in the Background.

To achieve the above purpose, the invention uses the following technical solutions:

A first aspect of the present application provides a gas density relay check device, including: a temperature adjusting mechanism, at least one pressure sensor, at least one temperature sensor, a computer data processing system and a contact signal sampling unit, wherein the temperature adjusting mechanism is an adjusting mechanism for adjusting temperatures, the temperature adjusting mechanism is configured to adjust temperature rise and fall of a temperature compensation element of a gas density relay, to enable the gas density relay to have a contact action;

the contact signal sampling unit, is connected with a contact of the gas density relay, and is configured to sample a contact signal generated when the contact of the gas density relay operates, and the contact signal includes alarm, and/or locking; and the computer data processing system, is connected with the pressure sensor, the temperature sensor, the temperature adjusting mechanism and the contact signal sampling unit respectively, and is configured to complete control on the temperature adjusting mechanism, pressure value acquisition and temperature value acquisition, and/or gas density value acquisition, and to detect a contact signal operating value and/or a contact signal return value of the gas density relay.

Preferably, the computer data processing system acquires a gas density value acquired by the pressure sensor and the temperature sensor when the gas density relay has the contact action or is switched, to complete check on the gas density relay; or the computer data processing system acquires a pressure value acquired by the pressure sensor and a temperature value acquired by the temperature sensor when the gas density relay has the contact action or is switched, and converts the values into a corresponding 20° C. pressure value according to a pressure-temperature property of a gas, that is, a gas density value, to complete check on the gas density relay.

Preferably, the gas density relay check device also includes a gas source providing mechanism, and the gas source providing mechanism is communicated with a checked gas density relay on a gas path, and is used to provide a gas source with set pressure for the gas density relay.

More preferably, the gas source providing mechanism includes, but not limited to one of a gas storage tank, a miniature gas cylinder, a pressure pump, a booster pump, an electrical gas pump and an electromagnetic gas pump.

Preferably, the temperature adjusting mechanism is a heating element; or
  the temperature regulation mechanism includes a heating element, a heat insulation element, a temperature controller, a temperature detector, and a temperature regulation mechanism outer shell; or
  the temperature regulation mechanism includes a heating element and a temperature controller; or
  the temperature regulation mechanism includes a heating element, a heating power regulator, and a temperature controller; or
  the temperature regulation mechanism includes a heating element, a refrigeration element, a heating power regulator, and a temperature controller; or
  the temperature regulation mechanism includes a heating element, a heating power regulator, and a thermostatic controller; or
  the temperature regulation mechanism includes a heating element, a temperature controller, and a temperature detector; or
  the temperature regulation mechanism is a heating element, and the heating element is provided near the temperature compensation element; or
  the temperature regulation mechanism is a miniature constant temperature box;
  the number of the heating element is at least one, the heating element includes, but not limited to one of a resistance wire, an electric heating tape, an electric heating rod, a hot gas fan, an infrared ray heating element and a semiconductor;
  the temperature controller is connected with the heating element, and is used for controlling the heating temperature of the heating element, and the temperature controller includes, but not limited to one of a PID controller, a controller with the combination of PID and fuzzy control, and an inverter controller.

Preferably, the temperature adjusting mechanism is arranged inside the checked gas density relay; or, the temperature adjusting mechanism is arranged outside the checked gas density relay.

Preferably, the gas density relay check device also includes a housing or a box, and the pressure sensor and the computer data processing system are arranged on the housing or the box.

Preferably, in check, the temperature sensor is arranged on the housing of the checked gas density relay, or is arranged inside the housing of the gas density relay, or is arranged in the vicinity of the temperature compensation element inside the housing of the gas density relay.

Preferably, the pressure sensor includes, but not limited to a relative pressure sensor, and/or an absolute pressure sensor.

Preferably, the gas density relay check device also includes a pressure adjusting mechanism, and in check, the gas path of the pressure adjusting mechanism is communicated with the gas path of the checked gas density relay; and the pressure adjusting mechanism is configured to adjust pressure rise and fall of the gas density relay, and then cooperates and/or combines with the temperature adjusting mechanism to enable the gas density relay to have the contact action.

More preferably, the pressure adjusting mechanism is sealed inside a cavity a housing.

More preferably, the pressure adjusting mechanism has manual adjusting, or automatic adjusting.

Further, the pressure adjusting mechanism includes a pressure adjusting cylinder, a piston, an adjusting rod and a hand wheel, and the adjusting rod is driven by turning the hand wheel to drive the piston to move in the pressure adjusting cylinder, to achieve adjusting on the pressure of a gas source in the pressure adjusting cylinder.

Further, in check, the pressure adjusting mechanism is a closed air chamber, a heating element, and/or a refrigeration element are arranged outside or inside the closed air chamber, through heating of the heating element, and/or refrigeration of the refrigeration element, the temperature of the gas in the closed air chamber changes, and then pressure rise and fall of the checked gas density relay is completed; or
  the pressure adjusting mechanism is a cavity with an opening at one end, and the other end of the cavity is communicated with the gas density relay; the cavity is internally provided with a piston, one end of the piston is connected with an adjusting rod, the outer end of the adjusting rod is connected with a drive part, the other end of the piston extends into the opening and is in sealed contact with the inner wall of the cavity, and the adjusting rod is driven by the drive part to drive the piston to move in the cavity; or
  the pressure adjusting mechanism is a sealed air chamber, the sealed air chamber is internally provided with a piston, the piston is in sealed contact with the inner wall of the sealed air chamber, a drive part is arranged outside the sealed air chamber, and the drive part electromagnetically pushes the piston to move in the cavity; or,
  the pressure adjusting mechanism is an airbag of which one end is connected with a drive part, the airbag has volume changes under the driving of the drive part, and the airbag is communicated with the gas path of the gas density relay; or
  the pressure adjusting mechanism is a bellow, one end of the bellow is communicated with the gas path of the gas density relay, and the other end of the bellow extends and withdraws under the driving of the drive part; or
  the pressure adjusting mechanism is a deflation valve, the deflation valve is a solenoid valve or a valve with electrically motorized operation, or is other deflation valve achieved electrically or pneumatically; or
  the pressure adjusting mechanism is a compressor; or
  the pressure adjusting mechanism is a pump, and the pump includes, but not limited to one of a pressure pump, a booster pump, an electric air pump and an electromagnetic gas pump;
  the drive part includes, but not limited to one of a magnetic, motor and reciprocating mechanism, a Carnot cycle mechanism and a pneumatically operated element.

More further, the pressure adjusting mechanism also includes a heat insulation element, and the heat insulation element is arranged outside the closed air chamber.

Preferably, the contact signal sampling unit meets the following when sampling contact signals of the checked gas density relay:
  the contact signal sampling unit has at least two independent groups of sampling contacts, is capable of simultaneously automatically checking at least two contacts, and measures consecutively without changing contacts or reselecting contacts;
  the contacts include, but not limited to one of an alarm contact, an alarm contact+locking contact, an alarm contact+locking 1 contact+locking 2 contact, and alarm contact+locking contact+overpressure contact.

Preferably, the computer data processing system has an electric interface, and the electric interface completes test data storage, and/or test data export, and/or test data printing, and/or data communication with a host, and/or input of analog quantity and digital quantity information.

More preferably, the gas density relay check device supports basic information input of the gas density relay, and the basic information includes, but not limited to one or more of manufacturing numbers, accuracy requirements, rated parameters, manufacturers and operating positions.

Preferably, the gas density relay check device also includes a communication module for achieving remote transmission of test data, and/or check results, the communication module is arranged inside or outside the computer data processing system, and the communication module has a communication mode of wire communication or wireless communication.

Preferably, the computer data processing system is also provided with a clock, and the clock is configured to set up a check time of the gas density relay, or record a test time, or record an event time.

Preferably, the computer data processing system controls in the field, and/or controls through a background.

Preferably, the gas density relay check device also includes a display interface for man-machine interaction, and the display interface is connected with the computer data processing system, and is used to display current check data in real time, and/or support data input.

Preferably, the gas density relay check device also includes a microwater sensor for monitoring a gas microwater value, and the microwater sensor is connected with the checked gas density relay and the computer data processing system respectively; and/or
the gas density relay check device also includes a decomposition sensor for monitoring a gas decomposition, and the decomposition sensor is connected with the checked gas density relay and the computer data processing system respectively.

Preferably, the gas density relay check device also includes a contact resistance detection unit; and in check, the contact resistance detection unit is connected with the contact of the checked gas density relay, and the contact resistance detection unit is used for detecting a contact resistance value of the gas density relay.

Preferably, the computer data processing system carries out data processing according to whether the checked gas density relay is an absolute pressure relay or a relative pressure relay, whether a sensor for measurement is an absolute pressure sensor or a relative pressure sensor, a temperature value in test and a pressure-temperature property relationship of a gas, to obtain a corresponding 20° C. pressure value, and achieve accurate test on the performance of the gas density relay.

More preferably, data processing contents of the computer data processing system include:
1) when the absolute pressure relay is measured with the absolute pressure sensor, a measured absolute pressure value is directly converted into a corresponding 20° C. absolute pressure value according to the temperature value in test and the pressure-temperature property relationship of the gas;
2) when the relative pressure relay is measured with the relative pressure sensor, a measured relative pressure value is directly converted into a corresponding 20° C. relative pressure value according to the temperature value in test and the pressure-temperature property relationship of the gas;
3) when the relative pressure relay is measured with the absolute pressure sensor, the measured absolute pressure value is first converted into a relative pressure value, in a conversion relational expression: $P_{measured\ relative\ pressure} = P_{measured\ absolute\ pressure} - P_{local\ atmospheric\ pressure}$, and is converted into a corresponding 20° C. relative pressure value according to the temperature value in test and the pressure-temperature property relationship of the gas;
4) when the absolute pressure relay is measured with the relative pressure sensor, a measured relative pressure value is first converted into the absolute pressure value, in a conversion relational expression: $P_{measured\ absolute\ pressure} = P_{measured\ relative\ pressure} + P_{local\ atmospheric\ pressure}$, and is converted into the corresponding 20° C. absolute pressure value according to the temperature value in test and the pressure-temperature property relationship of the gas.

More preferably, data processing contents of the computer data processing system also include:
when the relative pressure relay is measured with the absolute pressure sensor, the measured absolute pressure value is first converted into the corresponding 20° C. absolute pressure value according to the temperature value in test and the pressure-temperature property relationship of the gas, and is converted into the corresponding 20° C. relative pressure value, in a conversion relational expression: $P_{20\ measured\ relative\ pressure} = P_{20\ measured\ absolute\ pressure} - P_{local\ atmospheric\ pressure}$;
when the absolute pressure relay is measured with the relative pressure sensor, the measured relative pressure value is first converted into the corresponding 20° C. relative pressure value according to the temperature value in test and the pressure-temperature property relationship of the gas, and is converted into the corresponding 20° C. absolute pressure value, in a conversion relational expression: $P_{20\ measured\ absolute\ pressure} = P_{20\ measured\ relative\ pressure} + P_{local\ atmospheric\ pressure}$.

More preferably, when the absolute pressure relay is expressed with the absolute pressure value, a test result thereof is the corresponding 20° C. absolute pressure value, and when expressed with the relative pressure value, the test result thereof is converted into the corresponding 20° C. relative pressure value; when the relative pressure relay is expressed with the relative pressure value, the test result thereof is the corresponding 20° C. relative pressure value, and when expressed with the absolute pressure value, the test result thereof is converted into the corresponding 20° C. absolute pressure value; and the conversion relationship between the absolute pressure value and the relative pressure value is: $P_{absolute\ pressure} = P_{relative\ pressure} + P_{standard\ atmospheric\ pressure}$.

Preferably, the gas density relay check device also includes a display screen, and the display screen is configured to display test data of the check process and/or check results.

More preferably, the gas density relay check device also includes an operation keyboard, and the operation keyboard is integrally linked with the display screen.

Preferably, the gas density relay check device may be designed to be applicable to use in a laboratory, or designed to be portable for check in the field, or designed to be applicable to online check in the field.

A second aspect of the present application provides a check method of a gas density relay check device, and the gas density relay check device includes a temperature adjusting mechanism, at least one pressure sensor, at least one temperature sensor, a computer data processing system, a contact signal sampling unit and a gas source providing mechanism; the check method includes:

in check, relatively setting the temperature adjusting mechanism and a checked gas density relay;

connecting the contact signal sampling unit with a contact of the gas density relay;

communicating the gas source providing mechanism with the gas density relay on a gas path; operating or controlling the gas source providing mechanism manually or through the computer data processing system, to provide a gas of set pressure for the gas density relay, and charge the gas density relay with the gas of the set pressure;

operating or controlling the temperature adjusting mechanism manually or through the computer data processing system, to rise the temperature of the gas density relay, then rise the temperature of a temperature compensation element of the gas density relay, and enable the gas density relay to have a contact action, the contact action is transmitted to the computer data processing system through the contact signal sampling unit, and the computer data processing system obtains a gas density value according to a pressure value and a temperature value in the contact action, or directly obtains the gas density value, and detects a contact signal operating value of the gas density relay, to complete check on the contact signal operating value of the gas density relay; and after all contact signal check is completed, powering off a heating element of the temperature adjusting mechanism manually or through the computer data processing system.

Preferably, the check method of the gas density relay check device, also includes:

in check, relatively setting the temperature adjusting mechanism and a checked gas density relay;

connecting the contact signal sampling unit with a contact of the gas density relay;

communicating the gas source providing mechanism with the gas density relay on a gas path;

operating or controlling the gas source providing mechanism manually or through the computer data processing system, to provide a gas of set pressure for the gas density relay, and charge the gas density relay with the gas of the set pressure;

operating or controlling the temperature adjusting mechanism manually or through the computer data processing system, to rise the temperature of the gas density relay, then rise the temperature of a temperature compensation element of the gas density relay, and enable the gas density relay to have a contact action, the contact action is transmitted to the computer data processing system through the contact signal sampling unit, and the computer data processing system obtains a gas density value according to a pressure value and a temperature value in the contact action, or directly obtains the gas density value, and detects a contact signal operating value of the gas density relay, to complete check on the contact signal operating value of the gas density relay; and operating or controlling the temperature adjusting mechanism manually or through the computer data processing system, to reduce the temperature of the gas density relay, then reduce the temperature of the temperature compensation element of the gas density relay, and enable the gas density relay to have contact reset, the contact reset is transmitted to the computer data processing system through the contact signal sampling unit, and the computer data processing system obtains the gas density value according to the pressure value and the temperature value in the contact reset, or directly obtains the gas density value, and detects a contact signal return value of the gas density relay, to complete check on the contact signal return value of the gas density relay; and after all contact signal check is completed, powering off the heating element of the temperature adjusting mechanism manually or through the computer data processing system.

Preferably, the gas density relay check device also includes a pressure adjusting mechanism, the gas path of the pressure adjusting mechanism is communicated with the gas path of the checked gas density relay; and the check method of the gas density relay check device also includes:

in check, relatively setting the temperature adjusting mechanism and a checked gas density relay;

connecting the contact signal sampling unit with a contact of the gas density relay;

communicating the gas source providing mechanism with the gas density relay on a gas path; operating or controlling the gas source providing mechanism manually or through the computer data processing system, to provide a gas of set pressure for the gas density relay, and charge the gas density relay with the gas of the set pressure;

driving the pressure adjusting mechanism manually or through the computer data processing system, to slowly reduce the pressure of the gas, and operating or controlling the temperature adjusting mechanism manually or through the computer data processing system, to rise the temperature of the gas density relay, then rise the temperature of the temperature compensation element of the gas density relay, and enable the gas density relay to have the contact action, the contact action is transmitted to the computer data processing system through the contact signal sampling unit, and the computer data processing system obtains the gas density value according to a pressure value and a temperature value in the contact action, or directly obtains the gas density value, and detects the contact signal operating value of the gas density relay, to complete check on the contact signal operating value of the gas density relay;

after all contact signal check is completed, powering off the heating element of the temperature adjusting mechanism manually or through the computer data processing system.

Preferably, the gas density relay check device also includes a pressure adjusting mechanism, the gas path of the pressure adjusting mechanism is communicated with the gas path of the checked gas density relay; and the check method of the gas density relay check device also includes:

in check, relatively setting the temperature adjusting mechanism and a checked gas density relay;

connecting the contact signal sampling unit with a contact of the gas density relay;

communicating the gas source providing mechanism with the gas density relay on a gas path; operating or controlling the gas source providing mechanism manually or through the computer data processing system, to provide a gas of set pressure for the gas density relay, and charge the gas density relay with the gas of the set pressure;

operating or controlling the temperature adjusting mechanism manually or through the computer data processing system, to rise the temperature of the gas density relay, then rise the temperature of the temperature compensation element of the gas density relay, and driving the pressure adjusting mechanism manually or through the computer data processing system, to slowly reduce the pressure of the gas, and enable the gas density relay to have the contact action, the contact action is transmitted to the computer data processing system through the contact signal sampling unit, and the computer data processing system obtains the gas density value according to the pressure value and the temperature value in the contact action, or directly obtains the gas density value, and detects the contact signal operating value of the gas density relay, to complete check on the contact signal operating value of the gas density relay;

operating or controlling the temperature adjusting mechanism manually or through the computer data processing system, to reduce the temperature of the gas density relay, then reduce the temperature of the temperature compensation element of the gas density relay, and driving the pressure adjusting mechanism manually or through the computer data processing system, to slowly rise the pressure of the gas, and enable the gas density relay to have contact reset, the contact reset is transmitted to the computer data processing system through the contact signal sampling unit, and the computer data processing system obtains the gas density value according to the pressure value and the temperature value in the contact reset, or directly obtains the gas density value, and detects the contact signal return value of the gas density relay, to complete check on the contact signal return value of the gas density relay;

after all contact signal check is completed, powering off the heating element of the temperature adjusting mechanism manually or through the computer data processing system.

A third aspect of the present application provides a check method of a gas density relay check device, including:

in check, relatively setting the temperature adjusting mechanism and a checked gas density relay;

connecting the contact signal sampling unit with a contact of the gas density relay;

communicating a pressure sensor with the gas density relay on a gas path;

operating or controlling the temperature adjusting mechanism manually or through the computer data processing system, to rise the temperature of the gas density relay, then rise the temperature of a temperature compensation element of the gas density relay, and enable the gas density relay to have a contact action, the contact action is transmitted to the computer data processing system through the contact signal sampling unit, and the computer data processing system obtains a gas density value according to a pressure value and a temperature value in the contact action, or directly obtains the gas density value, and detects a contact signal operating value of the gas density relay, to complete check on the contact signal operating value of the gas density relay; and after all contact signal check is completed, powering off a heating element of the temperature adjusting mechanism manually or through the computer data processing system.

Preferably, the check method of the gas density relay check device, also includes:

in check, relatively setting the temperature adjusting mechanism and a checked gas density relay;

connecting the contact signal sampling unit with a contact of the gas density relay;

communicating a pressure sensor with the gas density relay on a gas path;

operating or controlling the temperature adjusting mechanism manually or through the computer data processing system, to rise the temperature of the gas density relay, then rise the temperature of a temperature compensation element of the gas density relay, and enable the gas density relay to have a contact action, the contact action is transmitted to the computer data processing system through the contact signal sampling unit, and the computer data processing system obtains a gas density value according to a pressure value and a temperature value in the contact action, or directly obtains the gas density value, and detects a contact signal operating value of the gas density relay, to complete check on the contact signal operating value of the gas density relay; and operating or controlling the temperature adjusting mechanism manually or through the computer data processing system, to reduce the temperature of the gas density relay, then reduce the temperature of the temperature compensation element of the gas density relay, and enable the gas density relay to have contact reset, the contact reset is transmitted to the computer data processing system through the contact signal sampling unit, and the computer data processing system obtains the gas density value according to the pressure value and the temperature value in the contact reset, or directly obtains the gas density value, and detects a contact signal return value of the gas density relay, to complete check on the contact signal return value of the gas density relay; and after all contact signal check is completed, powering off the heating element of the temperature adjusting mechanism manually or through the computer data processing system.

Preferably, the gas density relay check device also includes a pressure adjusting mechanism, the gas path of the pressure adjusting mechanism is communicated with the gas path of the checked gas density relay; and the check method of the gas density relay check device also includes:

in check, relatively setting the temperature adjusting mechanism and a checked gas density relay;

connecting the contact signal sampling unit with a contact signal of the gas density relay;

communicating a pressure sensor with the gas density relay on a gas path;

closing a valve between the gas density relay and electrical equipment;

driving the pressure adjusting mechanism manually or through the computer data processing system, to slowly reduce the pressure of the gas, and operating or controlling the temperature adjusting mechanism manually or through the computer data processing system, to rise the temperature of the gas density relay, then rise the temperature of the temperature compensation element of the gas density relay, and enable the gas density relay to have the contact action, the contact action is transmitted to the computer data processing system through the contact signal sampling unit, and the computer data processing system obtains the gas density value according to a pressure value and a temperature value in the contact action, or directly obtains the gas density value, and detects the contact signal operating value of the gas density relay, to complete check on the contact signal operating value of the gas density relay;

after all contact signal check is completed, powering off the heating element of the temperature adjusting mechanism manually or through the computer data processing system.

Preferably, the gas density relay check device also includes a pressure adjusting mechanism, the gas path of the pressure adjusting mechanism is communicated with the gas path of the checked gas density relay; and the check method of the gas density relay check device also includes:

in check, relatively setting the temperature adjusting mechanism and a checked gas density relay;

connecting the contact signal sampling unit with a contact of the gas density relay;

communicating a pressure sensor with the gas density relay on a gas path;

closing a valve between the gas density relay and electrical equipment;

operating or controlling the temperature adjusting mechanism manually or through the computer data processing system, to rise the temperature of the gas density relay, then rise the temperature of the temperature compensation element of the gas density relay, and driving the pressure adjusting mechanism manually or through the computer data processing system, to slowly reduce the pressure of the gas, and enable the gas density relay to have the contact action, the contact action is transmitted to the computer data processing system through the contact signal sampling unit, and the computer data processing system obtains the gas density value according to the pressure value and the temperature value in the contact action, or directly obtains the gas density value, and detects the contact signal operating value of the gas density relay, to complete check on the contact signal operating value of the gas density relay;

operating or controlling the temperature adjusting mechanism manually or through the computer data processing system, to reduce the temperature of the gas density relay, then reduce the temperature of the temperature compensation element of the gas density relay, and driving the pressure adjusting mechanism manually or through the computer data processing system, to slowly rise the pressure of the gas, and enable the gas density relay to have contact reset, the contact reset is transmitted to the computer data processing system through the contact signal sampling unit, and the computer data processing system obtains the gas density value according to the pressure value and the temperature value in the contact reset, or directly obtains the gas density value, and detects the contact signal return value of the gas density relay, to complete check on the contact signal return value of the gas density relay;

after all contact signal check is completed, powering off the heating element of the temperature adjusting mechanism manually or through the computer data processing system.

A fourth aspect of the present application provides a check method of a gas density relay check device, including:

relatively setting a temperature adjusting mechanism and a checked gas density relay;

connecting the contact signal sampling unit with a contact of the gas density relay;

communicating a pressure sensor with the gas density relay on a gas path;

monitoring, by the gas density relay in a normal operating state, a gas density value in an electrical equipment;

the gas density relay check device, according to a set check time, and the situation of a gas density value and/or the situation of a temperature value, in a situation of allowing and/or being possible to check the gas density relay:

controlling the temperature adjusting mechanism through a computer data processing system, to rise the temperature of the gas density relay, then rise the temperature of a temperature compensation element of the gas density relay, and enable the gas density relay to have a contact action, the contact action is transmitted to the computer data processing system through the contact signal sampling unit, and the computer data processing system obtains a gas density value according to a pressure value and a temperature value in the contact action, or directly obtains the gas density value, and detects a contact signal operating value of the gas density relay, to complete check on the contact signal operating value of the gas density relay; and after all contact signal check is completed, powering off a heating element of the temperature adjusting mechanism through the computer data processing system.

Preferably, the check method of the gas density relay check device, also includes:

in a normal working state, monitoring the gas density value in electrical equipment by the gas density relay, and monitoring the gas density value in the electrical equipment by the gas density relay or check device through a gas density detection sensor and the computer data processing system on line;

the gas density relay check device, according to a set check time, and the situation of a gas density value and/or the situation of a temperature value, in a situation of allowing and/or being possible to check the gas density relay:

adjusting the contact signal sampling unit to a check state through the computer data processing system, and in a check state, the contact signal sampling unit cuts off a control loop of a contact signal of the gas density relay, and connects a contact of the gas density relay to the computer data processing system;

controlling the temperature adjusting mechanism through a computer data processing system, to rise the temperature of the gas density relay, then rise the temperature of a temperature compensation element of the gas density relay, and enable the gas density relay to have a contact action, the contact action is transmitted to the computer data processing system through the contact signal sampling unit, and the computer data processing system obtains a gas density value according to a pressure value and a temperature value in the contact action, or directly obtains the gas density value, and detects a contact signal operating value of the gas density relay, to complete check on the contact signal operating value of the gas density relay; and controlling the temperature adjusting mechanism through the computer data processing system, to reduce the temperature of the gas density relay, then reduce the temperature of the temperature compensation element of the gas density relay, and enable the gas density relay to have contact reset, the contact reset is transmitted to the computer data processing system through the contact signal sampling unit, and the computer data processing system obtains the gas density value according to the pressure value and the temperature value in the contact reset, or directly obtains the gas density value, and detects a contact signal return value of the gas density relay, to complete check on the contact signal return value of the gas density relay; and after all contact signal check is completed, powering off the heating element of the temperature adjusting mechanism by the computer data processing system, and adjusting the contact signal sampling unit to a working state, and then recovering the control loop of the contact signal of the gas density relay to a normal working state.

Preferably, the gas density relay check device also includes a pressure adjusting mechanism and a valve, the gas path of the pressure adjusting mechanism is communicated with the gas path of the checked gas density relay, one end of the valve is provided with a connection hole communicated with the electrical equipment, and the other end of the valve is communicated with the gas path of the checked gas density relay check device; the check method also includes:

monitoring, by the gas density relay in a normal operating state, a gas density value in an electrical equipment;

the gas density relay check device, according to a set check time, and the situation of a gas density value and/or the situation of a temperature value, in a situation of allowing and/or being possible to check the gas density relay:

closing the valve through the computer data processing system;

driving the pressure adjusting mechanism through the computer data processing system, to slowly reduce the pressure of the gas, and controlling the temperature adjusting mechanism through the computer data processing system, to rise the temperature of the gas density relay, then rise the temperature of the temperature compensation element of the gas density relay, and enable the gas density relay to have the contact action, the contact action is transmitted to the computer data processing system through the contact signal sampling unit, and the computer data processing system obtains the gas density value according to the pressure value and the temperature value in the contact action, or directly obtains the gas density value, and detects the contact signal operating value of the gas density relay, to complete check on the contact signal operating value of the gas density relay; and after all contact signal check is completed, opening the valve by the computer data processing system, and powering off the heating element of the temperature adjusting mechanism by the computer data processing system.

Preferably, the gas density relay check device also includes a pressure adjusting mechanism and a valve, the gas path of the pressure adjusting mechanism is communicated with the gas path of the checked gas density relay, one end of the valve is provided with a connection hole communicated with the electrical equipment, and the other end of the valve is communicated with the gas path of the checked gas density relay check device; the check method also includes:

in a normal working state, monitoring the gas density value in electrical equipment by the gas density relay, and monitoring the gas density value in the electrical equipment by the gas density relay or check device through a gas density detection sensor and the computer data processing system on line;

the gas density relay check device, according to a set check time, and the situation of the gas density value and/or the situation of the temperature value, in the situation of allowing and/or being possible to check the gas density relay:

closing the valve through the computer data processing system;

adjusting the contact signal sampling unit to a check state through the computer data processing system, and in a check state, the contact signal sampling unit cuts off a control loop of a contact signal of the gas density relay, and connects a contact of the gas density relay to the computer data processing system;

controlling the temperature adjusting mechanism through the computer data processing system, to rise the temperature of the gas density relay, then rise the temperature of the temperature compensation element of the gas density relay, and driving the pressure adjusting mechanism through the computer data processing system, to slowly reduce the pressure of the gas, and enable the gas density relay to have the contact action, the contact action is transmitted to the computer data processing system through the contact signal sampling unit, and the computer data processing system obtains the gas density value according to the pressure value and the temperature value in the contact action, or directly obtains the gas density value, and detects the contact signal operating value of the gas density relay, to complete check on the contact signal operating value of the gas density relay;

controlling the temperature adjusting mechanism through the computer data processing system, to reduce the temperature of the gas density relay, then reduce the temperature of the temperature compensation element of the gas density relay, and driving the pressure adjusting mechanism through the computer data processing system, to slowly rise the pressure of the gas, and enable the gas density relay to have contact reset, the contact reset is transmitted to the computer data processing system through the contact signal sampling unit, and the computer data processing system obtains the gas density value according to the pressure value and the temperature value in the contact reset, or directly obtains the gas density value, and detects the contact signal return value of the gas density relay, to complete check on the contact signal return value of the gas density relay; and after all contact signal check is completed, opening the valve by the computer data processing system, powering off the heating element of the temperature adjusting mechanism by the computer data processing system, adjusting the contact signal sampling unit to the working state, and then recovering the control loop of the contact signal of the gas density relay to the normal working state.

Compared with the prior art, technical solutions in the invention have the following beneficial effects:

1) The gas density relay check device is provided, including: the temperature adjusting mechanism, at least one pressure sensor, at least one temperature sensor, the computer data processing system and the contact signal sampling unit. In check, the temperature adjusting mechanism and the gas density relay are relatively set, temperature rise and fall of the temperature compensation element of the gas density relay is adjusted through the temperature adjusting mechanism, then the gas density relay is enabled to have a contact signal action, the gas density value is obtained according to the pressure value and the temperature value in the contact action, the contact signal operating value of the gas density relay is detected, and check on the contact signal operating value of the gas density relay is completed. The gas density relay check device of the present application is capable of accurately checking gas density relays of various measuring principles in various situations, and is particularly applicable to a gas density relay without a three-way valve, and check can be achieved without disassembling the gas density relay. Meanwhile, the whole check process of the present application achieves zero emission of the $SF_6$ gas, meeting requirements of environment protection regulations.

2) The check method of the gas density relay check device is provided, supporting normal operation of the check device.

BRIEF DESCRIPTION OF DRAWINGS

The drawings, which form a part of the application, are used to provide a further understanding of the application, and the illustrative embodiments and descriptions of the application are used to explain the application, and do not constitute undue restrictions on the application. In the drawings.

DETAILED DESCRIPTION OF THE EMBODIMENTS

Embodiment I

Figure 1:
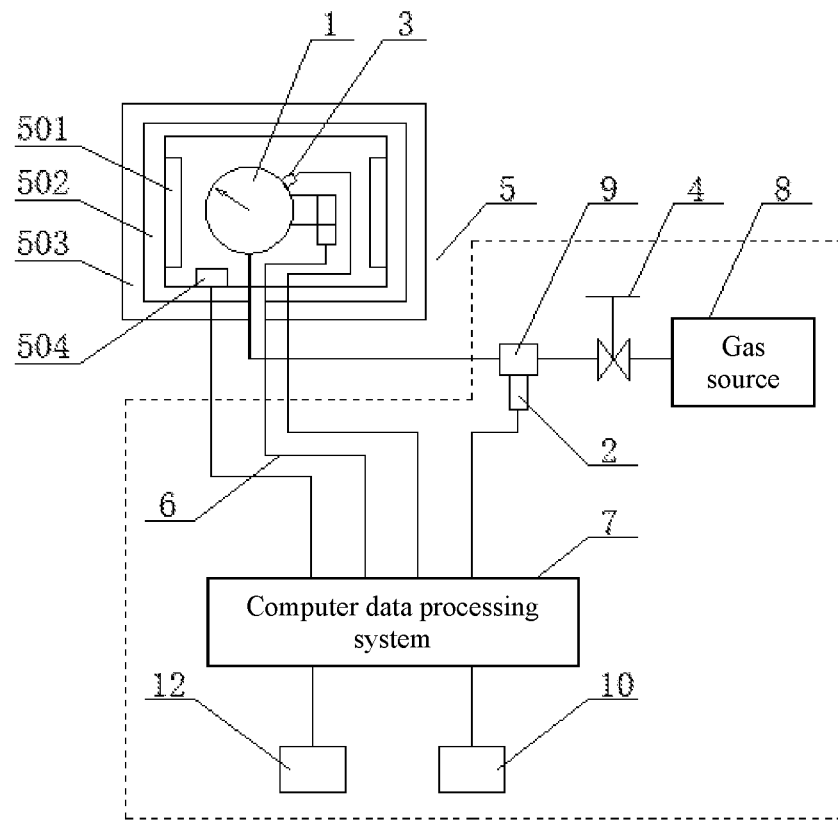
FIG. 1 is a structural schematic diagram of a gas density relay check device of an Embodiment I.

Referring to FIG. 1, a gas density relay check device, includes a temperature adjusting mechanism 5, at least one pressure sensor 2, at least one temperature sensor 3, a valve 4, a contact signal sampling unit 6, a computer data processing system 7, a gas source providing mechanism 8, a multichannel joint 9, a display screen 10 and an operation keyboard 12. The pressure sensor 2, the valve 4, the computer data processing system 7, the gas source providing mechanism 8, the multichannel joint 9, the display screen 10 and the operation keyboard 12 are arranged in a box or housing. The gas source providing mechanism 8 may be stored with a gas for check, the gas source providing mechanism 8 is connected with the multichannel joint 9 through the valve 4, and the pressure sensor 2 is fixed on the multichannel joint 9 in a sealed manner. The multichannel joint 9 is provided with an interface, and may be connected with the gas density relay 1 on a gas path. The temperature adjusting mechanism 5 is an adjusting mechanism for adjusting temperatures; in check, the temperature adjusting mechanism 5 and the gas density relay 1 are relatively set; and the temperature sensor 3 is arranged on the housing of the gas density relay 1. The temperature adjusting mechanism 5 is configured to adjust temperature rise and fall of the temperature compensation element of the gas density relay 1, and to enable the gas density relay 1 to have a contact action; the contact signal sampling unit 6 is connected with the gas density relay 1, and is configured to sample a contact signal of the gas density relay 1; the contact signal includes alarm, and/or locking; the computer data processing system 7 is connected with the pressure sensor 2, the temperature sensor 3, the temperature adjusting mechanism 5, the contact signal sampling unit 6, the display screen 10 and the operation keyboard 12 respectively, and is configured to complete control on the temperature adjusting mechanism 5, pressure value acquisition and temperature value acquisition, and/or gas density value acquisition, and to detect a contact signal operating value and/or a contact signal return value of the gas density relay 1; and the display screen 10 is configured to display test data of the check process and/or test results. The operation keyboard 12 can input relevant parameters or information. The temperature adjusting mechanism 5 mainly consists of a heating element 501, a heat insulation element 502, a controller 504, the temperature detector 3 (the same as the temperature sensor), a temperature adjusting mechanism shell 503, etc. The controller 504 may use PID control, or use a control method of the combination of the PID and fuzzy control. The electric heating working power range of the heating element 501 is controlled by the controller 504 and a temperature rise and fall amplitude set value. The change amplitude of the temperature is controlled through different power. A deviation degree may be set to make it heat or cool in advance. For the temperature in the temperature adjusting mechanism 5, through the computer data processing system 7 and the controller 504, when the contact signal operating value of the gas density relay 1 is measured, the temperature change rate is not greater than 1.0° C. per second when approaching to the operating value (even not greater than 0.5° C. per second, or the requirement is set according to demands), that is, the temperature is required to rise or fall stably.

Figure 2:
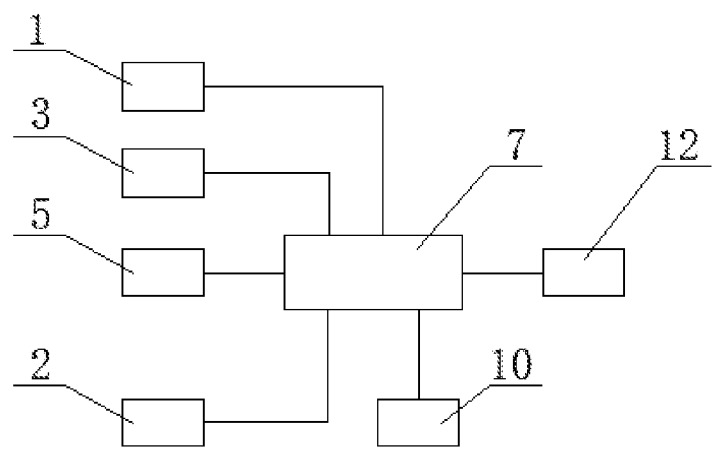
FIG. 2 is a schematic diagram of a gas density relay check device of an Embodiment I.

Referring to FIG. 2, FIG. 2 is a schematic diagram of a gas density relay check device of an Embodiment I, and working principles and implementation steps thereof are as follows: in check, the temperature adjusting mechanism 5 and the gas density relay 1 are relatively set; the contact signal sampling unit 6 is connected with the gas density relay 1, specifically, the contact signal sampling unit 6 is connected with the gas density relay 1; the gas source providing mechanism 8 is communicated with the gas density relay 1 on the gas path, specifically connected directly or through a connecting tube, that is, the gas density relay 1 is connected with the interface of the multichannel joint 9 directly or through a connecting tube; the gas source providing mechanism 8 is operated or controlled manually or through the computer data processing system 7 (automatically), to provide a gas of certain pressure for the gas density relay 1, and charge the gas density relay 1 with the gas of the certain pressure. Specifically, an air charge pressure value is obtained through artificial experience or calculation according to an ambient temperature value in check and the situation of a temperature value to be checked, or the air charge pressure value is obtained through the computer data processing system 7 (automatically). For example, a gas density relay with density relay parameters of 0.6/0.52/0.50 MPa (rated value 0.6 MPa/alarm pressure value 0.52 MPa/alarm pressure value 0.50 MPa, and relative pressure) is checked. When the ambient temperature is 5° C., gas pressure of 0.5562 MPa can be charged, and the gas may also be charged till the pointer of the gas density relay points to rated pressure.

The temperature adjusting mechanism 5 is operated or controlled manually or through the computer data processing system 7, to rise the temperature of the gas density relay 1, and then rise the temperature of the temperature compensation element of the gas density relay, the temperature change rate is not greater than 1.0° C. per second when approaching to the operating value (even not greater than 0.5° C. per second, or the requirement is set according to demands), that is, the temperature is required to rise or fall stably. Until the gas density relay 1 has the contact action, the contact action is transmitted to the computer data processing system 7 through the contact signal sampling unit 6, and the computer data processing system 7 obtains the gas density value according to the pressure value and the temperature value in the contact action, or directly obtains the gas density value, and detects the contact signal operating value of the gas density relay 1, to complete check on the contact signal operating value of the gas density relay. For example, for a gas density relay with density relay parameters of 0.6/0.52/0.50 MPa (rated value 0.6 MPa/alarm pressure value 0.52 MPa/alarm pressure value 0.50 MPa, and relative pressure), when the ambient temperature is 5° C., gas pressure of 0.5562 MPa (relative pressure) can be charged, the pressure value is unchanged (or generally unchanged) in a check system at the moment, when the temperature rises to 29.5° C., an alarm contact thereof has an action, the computer data processing system 7 obtains a gas density relay alarm contact operating value 0.5317 MPa (relative pressure) according to a pressure value 0.5562 MPa (relative pressure) and a temperature value 29.5° C. in the contact action, and the computer data processing system 7 obtains an error of the alarm contact operating value: 0.1117 MPa (0.5317 MPa−0.52 MPa=0.1117 MPa), to complete check on the alarm contact operating value of the gas density relay.

The temperature adjusting mechanism 5 is operated or controlled manually or through the computer data processing system 7, to reduce the temperature of the gas density relay 1, then reduce the temperature of the temperature compensation element of the gas density relay 1, and enable the gas density relay 1 to have contact reset, the contact reset is transmitted to the computer data processing system 7 through the contact signal sampling unit 6, the computer data processing system 7 obtains the gas density value according to the pressure value and the temperature value in the contact reset, or directly obtains the gas density value, and detects the contact signal return value of the gas density relay 7, to complete check on the contact signal return value of the gas density relay 1; for example, for a gas density relay with density relay parameters of 0.6/0.52/0.50 MPa (rated value 0.6 MPa/alarm pressure value 0.52 MPa/alarm pressure value 0.50 MPa, and relative pressure), when the ambient temperature is 5° C., the gas pressure of 0.5562 MPa (relative pressure) can be charged, the pressure value is unchanged (or generally unchanged) in the check system at the moment, when the temperature is reduced to 24.8° C., the alarm contact thereof has the contact reset, the computer data processing system 7 obtains a gas density relay alarm contact return value 0.5435 MPa (relative pressure) according to the pressure value 0.5562 MPa (relative pressure) and the temperature value 24.8° C. in the contact reset, and the computer data processing system 7 obtains a switching difference of the alarm contact: 0.0118 MPa (0.5435 MPa−0.5317 MPa=0.0118 MPa), to complete check on the alarm contact operating value of the gas density relay. The computer data processing system 7, according to requirements, and according check results (check data), determines the performance (e.g. qualified, or unqualified) of the checked gas density relay 1.

after all contact signal check is completed, powering off the heating element 501 of the temperature adjusting mechanism 5 manually or through the computer data processing system 7.

Embodiment II

Figure 3:
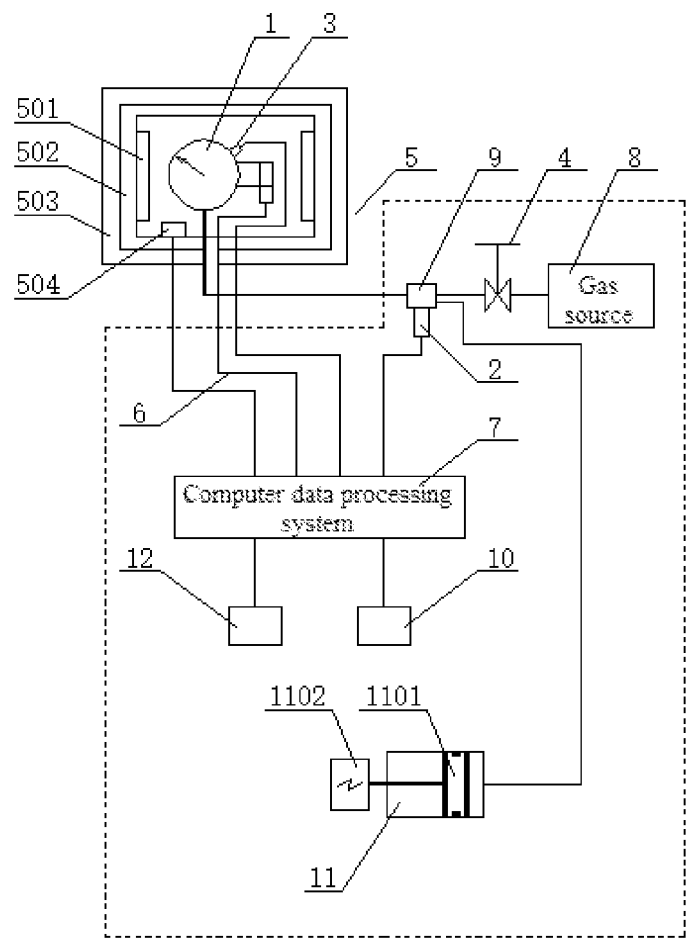
FIG. 3 is a structural schematic diagram of a gas density relay check device of an Embodiment II.

Referring to FIG. 3, a gas density relay check device of an Embodiment II of the present invention, includes a temperature adjusting mechanism 5, at least one pressure sensor 2, at least one temperature sensor 3, a valve 4, a contact signal sampling unit 6, a computer data processing system 7, a gas source providing mechanism 8, a multichannel joint 9, a display screen 10, an operation keyboard 12 and a pressure adjusting mechanism 11. Different from the Embodiment I, the Example also includes the pressure adjusting mechanism 11. The pressure adjusting mechanism 11 includes a pressure adjusting cylinder 1104, a piston 1101, an adjusting rod 1103 and a hand wheel or drive mechanism 1102, for example, the adjusting rod 1103 is driven by turning the hand wheel or through the drive mechanism 1102 to drive the piston 1101 to move in the pressure adjusting cylinder 1104, to achieve adjusting on the pressure of a gas source in the pressure adjusting cylinder 1104.

In the field of a substation, in check, the temperature adjusting mechanism 5 and the gas density relay 1 are relatively set; the contact signal sampling unit 6 is connected with the gas density relay 1, specifically, the contact signal sampling unit 6 is connected with the gas density relay 1; the gas density relay 1 is connected with an interface (an upper interface of a multichannel joint 9) of the check device through a connecting tube or directly, and the pressure sensor 2 of the check device is communicated with the gas density relay 1 on a gas path; a valve 4 between the gas density relay 1 and electrical equipment is closed; the pressure adjusting mechanism 11 is driven manually or through the computer data processing system 7, to slowly reduce the pressure of the gas density relay 1, and the operation can be stopped when the pressure is reduced to a target pressure value. Subsequently, the temperature adjusting mechanism 5 is operated or controlled manually or through the computer data processing system 7, to rise the temperature of the gas density relay 1, then rise the temperature of a temperature compensation element of the gas density relay 1, and enable the gas density relay 1 to have a contact action, the contact action is transmitted to the computer data processing system 7 through the contact signal sampling unit 6, the computer data processing system 7 obtains a gas density value according to a pressure value and a temperature value in the contact action, or directly obtains the gas density value, and detects a contact signal action value of the gas density relay 1, to complete check on the contact signal action value of the gas density relay 1, and the operation is similar to the Embodiment I.

The temperature adjusting mechanism 5 is operated or controlled manually or through the computer data processing system 7, to reduce the temperature of the gas density relay 1, then reduce the temperature of the temperature compensation element of the gas density relay 1, and enable the gas density relay 1 to have contact reset, the contact reset is transmitted to the computer data processing system 7 through the contact signal sampling unit 6, and the computer data processing system 7 obtains the gas density value according to the pressure value and the temperature value in the contact reset, or directly obtains the gas density value, and detects a contact signal return value of the gas density relay 1, to complete check on the contact signal return value of the gas density relay 1;

after all contact signal check is completed, powering off the heating element of the temperature adjusting mechanism 5 manually or through the computer data processing system 7. In the Embodiment, the temperature adjusting mechanism 5 and the pressure adjusting mechanism 11 are operated in a flexible sequence, that is, the pressure adjusting mechanism 11 may be first operated, and the temperature adjusting mechanism 5; or the temperature adjusting mechanism 5 is first operated, and the pressure adjusting mechanism 11; or the pressure adjusting mechanism 11 and the temperature adjusting mechanism 5 are operated at the same time.

Embodiment III

Figure 4:
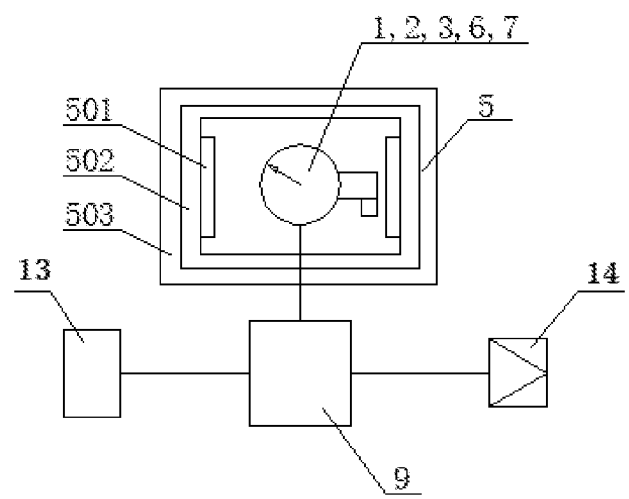
FIG. 4 is a structural schematic diagram of a gas density relay check device of an Embodiment III.

Referring to FIG. 4, FIG. 4 is a schematic diagram of an online check device of a gas density relay of an Embodiment III of the present invention. Specifically: a gas density relay 1 is mounted on electrical equipment 13 through a multi-channel joint 9, and an air admission joint 14 is arranged on the multichannel joint 9. A temperature adjusting mechanism 5 and a gas density relay 1 are relatively set, and the temperature adjusting mechanism 5, at least one pressure sensor 2, at least one temperature sensor 3, a contact signal sampling unit 6 and a computer data processing system 7 are fixed on the gas density relay 1; the contact signal sampling unit 6 is connected with the gas density relay 1, specifically, the contact signal sampling unit is connected with a contact of the gas density relay 1; and the pressure sensor 2 is communicated with the gas density relay 1 on a gas path.

In a normal working state, the gas density relay 1 monitors a gas density value in the electrical equipment 13; the gas density relay check device, according to a set check time, and the situation of a gas density value and/or the situation of a temperature value, in a situation of allowing and/or being possible to check the gas density relay 1:

1) adjusts the contact signal sampling unit 6 to a check state through the computer data processing system 7, and in a check state, the contact signal sampling unit 6 cuts off a control loop of a contact signal of the gas density relay 1, and connects the contact of the gas density relay 1 to the computer data processing system 7;

2) controls the temperature adjusting mechanism 5 through the computer data processing system 7, to rise the temperature of the gas density relay 1, then rise the temperature of a temperature compensation element of the gas density relay 1, and enable the gas density relay 1 to have a contact action, the contact action is transmitted to the computer data processing system 7 through the contact signal sampling unit 6, and the computer data processing system 7 obtains a gas density value $P_{20}$ according to a pressure value P and a temperature value T in the contact action, or directly obtains the gas density value $P_{20}$, and detects a contact signal action value of the gas density relay 1, to complete check on the contact signal operating value of the gas density relay 1; and 3) after all contact signal check is completed, the computer data processing system 7 powers off a heating element of the temperature adjusting mechanism 5. The contact signal sampling unit 6 is adjusted to a working state, and then the control loop of the contact signal of the gas density relay 1 is recovered to a normal working state.

Whether a tested $SF_6$ density relay is an absolute pressure relay or a relative pressure relay is confirmed from the instrument through man-machine communication, that is, through man-machine interface dialog or manual selection (a man-machine dialog or manual selection can be in flexible and various modes without limitation, for example, a selection button, a keyboard or a switch can be externally connected; a keyboard on a liquid crystal screen may be used, or a mode of questions and answers may be used, or operations are carried out by touching a touch screen on the liquid crystal screen, etc.). The operation may be completed through an operation keyboard 12.

An absolute pressure relay is measured with an absolute pressure sensor to obtain an absolute pressure value, and the absolute pressure value is automatically converted into a corresponding 20° C. absolute pressure value according to a temperature value (obtained through a temperature sensor 3) in test and a pressure-temperature property relationship of an $SF_6$ gas, to complete performance check on the $SF_6$ gas density relay.

When the absolute pressure relay is expressed with the absolute pressure value, a test result thereof is also the corresponding 20° C. absolute pressure value, and when expressed with the relative pressure value, the test result thereof may also be converted into the corresponding 20° C. relative pressure value; and the conversion relationship between absolute pressure and relative pressure is: $P_{absolute\ pressure} = P_{relative\ pressure} + P_{standard\ atmospheric\ pressure}$.

The relative pressure relay is measured with a relative pressure sensor to obtain a relative pressure value, and the relative pressure value is converted into a corresponding 20° C. relative pressure value according to a temperature value in test and a pressure-temperature property relationship of the $SF_6$ gas, to complete performance check on the $SF_6$ gas density relay.

When the relative pressure relay is expressed with the relative pressure value, a test result thereof is also the corresponding 20° C. absolute pressure value, and when expressed with the absolute pressure value, the test result thereof may also be converted into the corresponding 20° C. relative pressure value; and the conversion relationship between the absolute pressure and the relative pressure is: $P_{absolute\ pressure} = P_{relative\ pressure} + P_{standard\ atmospheric\ pressure}$.

In the Embodiment, the instrument is capable of accurately testing the performance of the checked density relay by using corresponding and appropriate pressure sensors respectively through man-machine communication, that is, man-machine dialog or manual selection according to whether the tested $SF_6$ gas density relay is the absolute pressure relay or the relative pressure relay, and the test accuracy is not affected by the atmospheric pressure.

The check method of the $SF_6$ gas density relay of the present invention has the main characteristics that:

1) Through communication of the instrument with test personnel, whether the tested $SF_6$ density relay works by using a method of measuring the absolute pressure value (absolute pressure relay), or works by using a method of measuring the relative pressure value (relative pressure relay) is selected or confirmed in test, and the instrument can be informed of the type of the tested $SF_6$ density relay.

2) A local atmospheric pressure is directly or indirectly obtained through test of the instrument self, or the local atmospheric pressure is input, or the local atmospheric pressure is stored in the instrument in advance, and the instrument is stored with the local atmospheric pressure.

3) Corresponding modification can be carried out according to the type of the tested $SF_6$ gas density relay in accordance with a pressure value test method of a used sensor (absolute pressure sensor or relative pressure sensor) and the local atmospheric pressure, then a pressure value test result is accurate, and the test accuracy is not affected by the atmospheric pressure.
4) The pressure value can be automatically converted into the corresponding 20° C. pressure value according to the temperature value in test and the pressure-temperature property relationship of the $SF_6$ gas, to complete accurate test on the performance of the $SF_6$ gas density relay; or the pressure value can be automatically converted into the corresponding 20° C. pressure value according to a pressure value test method of the tested $SF_6$ gas density relay, according to the temperature value in test, and according to the pressure-temperature property relationship of the $SF_6$ gas, then corresponding modification is carried out according to the pressure value test method of the used sensor and the local atmospheric pressure to obtain an accurate 20° C. pressure value, the test result is accurate, the test accuracy is not affected by the atmospheric pressure, and thus accurate test on the performance of the $SF_6$ gas density relay is completed.
5) Through communication of the instrument with test personnel, whether the tested $SF_6$ density relay works by using the method of measuring the absolute pressure value (absolute pressure relay), or works by using the method of measuring the relative pressure value (relative pressure relay) is selected or confirmed in test, that is, the instrument can be informed of the test method of the tested $SF_6$ density relay, that is, working by using the method of measuring the absolute pressure value or working by using the method of measuring the relative pressure value; and a corresponding sensor can be selected for measurement according to the test method of the tested $SF_6$ gas density relay, the test result is accurate, and the test accuracy is not affected by the atmospheric pressure. The pressure value can be automatically converted into the corresponding 20° C. pressure value according to the temperature value in test and according to the pressure-temperature property relationship of the $SF_6$ gas, to complete accurate test on the performance of the $SF_6$ gas density relay.
6) The instrument communicates with the test personnel in flexible and various modes without limitation, for example, the selection button, the selection switch and the keyboard can be externally connected, a keyboard on the liquid crystal screen may be used, or operations are carried out by touching the touch screen on the liquid crystal screen, or communication is carried out through man-machine dialog or selection, etc.
7) When the absolute pressure relay is expressed with the absolute pressure value, the test result thereof is also the corresponding 20° C. absolute pressure value, and when expressed with the relative pressure value, the test result thereof may also be the corresponding 20° C. relative pressure value.
8) When the relative pressure relay is expressed with the absolute pressure value, the test result thereof may also be the corresponding 20° C. absolute pressure value, and when expressed with the relative pressure value, the test result thereof may also be the corresponding 20° C. relative pressure value.
9) The instrument may measure by using the pressure sensor for measuring the absolute pressure value (absolute pressure sensor) and the pressure sensor for measuring the relative pressure value (relative pressure sensor).
10) The instrument may measure by completely using the pressure sensor for measuring the absolute pressure value (absolute pressure sensor).
11) The instrument may measure by completely using the pressure sensor for measuring the relative pressure value (relative pressure sensor).

The display screen may be omitted in online check in the field, and the check result is uploaded to target equipment through the communication module to display.

The embodiments of the present invention have been described in detail above, but are merely embodiments, and the present invention is not limited thereto. Any equivalent modifications and substitutions made to the present invention are also within the scope of the present invention for those skilled in the art. Therefore, equivalent changes and modifications made without departing from the spirit and scope of the present invention should be included within the scope of the present invention.

What is claimed is:
1. A gas density relay check device, comprising:
a temperature adjusting mechanism, at least one pressure sensor, at least one temperature sensor, a computer data processing system and a contact signal sampling unit, wherein
the temperature adjusting mechanism is an adjusting mechanism for adjusting temperatures, the temperature adjusting mechanism is configured to adjust temperature rise and fall of a temperature compensation element of a gas density relay, to enable the gas density relay to have a contact action;
the contact signal sampling unit, is connected with a contact of the gas density relay, and is configured to sample a contact signal generated when the contact of the gas density relay operates, and the contact signal includes alarm, and/or locking; and
the computer data processing system, is connected with the pressure sensor, the temperature sensor, the temperature adjusting mechanism and the contact signal sampling unit respectively, and is configured to complete control on the temperature adjusting mechanism, pressure value acquisition and temperature value acquisition, and/or gas density value acquisition, and to detect a contact signal operating value and/or a contact signal return value of the gas density relay.
2. The gas density relay check device according to claim 1, wherein the computer data processing system acquires a gas density value acquired by the pressure sensor and the temperature sensor when the gas density relay has the contact action or is switched, to complete check on the gas density relay; or
the computer data processing system acquires a pressure value acquired by the pressure sensor and a temperature value acquired by the temperature sensor when the gas density relay has the contact action or is switched, and converts the values into a corresponding 20° C. pressure value according to a pressure-temperature property of a gas, that is, a gas density value, to complete check on the gas density relay.
3. The gas density relay check device according to claim 1, wherein the gas density relay check device also comprises a gas source providing mechanism, wherein the gas source providing mechanism is communicated with a checked gas density relay in a gas path, and is used to provide a gas source with set pressure for the gas density relay; and the gas source providing mechanism comprises one of a gas storage tank, a miniature gas cylinder, a pressure pump, a booster pump, an electric air pump and an electromagnetic gas pump.

4. The gas density relay check device according to claim 1, wherein the temperature adjusting mechanism is a heating element; or the temperature regulation mechanism includes a heating element, a heat insulation element, a temperature controller, a temperature detector, and a temperature regulation mechanism outer shell; or the temperature regulation mechanism includes a heating element and a temperature controller; or the temperature regulation mechanism includes a heating element, a heating power regulator, and a temperature controller; or the temperature regulation mechanism includes a heating element, a refrigeration element, a heating power regulator, and a temperature controller; or the temperature regulation mechanism includes a heating element, a heating power regulator, and a thermostatic controller; or the temperature regulation mechanism includes a heating element, a temperature controller, and a temperature detector; or the temperature regulation mechanism is a heating element, and the heating element is provided near the temperature compensation element; or the temperature regulation mechanism is a miniature constant temperature box;

wherein the number of the heating element is at least one, and the heating element comprises one of a silicon rubber heater, a resistance wire, an electric heating tape, an electric heating rod, a hot gas fan, an infrared ray heating element, and a semiconductor;

the temperature controller is connected to the heating element and used for controlling a heating temperature of the heating element, and the temperature controller comprises one of a PID controller, a controller combining PID and fuzzy control, an inverter controller, and a PLC controller.

5. The gas density relay check device according to claim 1, wherein the gas density relay check device also comprises a pressure adjusting mechanism, and in check, the gas path of the pressure adjusting mechanism is communicated with the gas path of the checked gas density relay; the pressure adjusting mechanism is configured to adjust pressure rise and fall of the gas density relay, and then cooperates and/or combines with the temperature adjusting mechanism to enable the gas density relay to have the contact action; the pressure adjusting mechanism adjusts manually, or automatically.

6. The gas density relay check device according to claim 5, wherein the pressure adjusting mechanism comprises a pressure adjusting cylinder, a piston, an adjusting rod and a hand wheel, and the adjusting rod is driven by turning the hand wheel to drive the piston to move in the pressure adjusting cylinder, to achieve adjusting on the pressure of a gas source in the pressure adjusting cylinder; or the pressure adjusting mechanism is a closed air chamber, a heating element, and/or a refrigeration element are arranged outside or inside the closed air chamber, through heating of the heating element, and/or refrigeration of the refrigeration element, the temperature of the gas in the closed air chamber changes, and then pressure rise and fall of the checked gas density relay is completed; or the pressure adjusting mechanism is a cavity with an opening at one end, and the other end of the cavity is communicated with the gas density relay; the cavity is internally provided with a piston, one end of the piston is connected with an adjusting rod, the outer end of the adjusting rod is connected with a drive part, the other end of the piston extends into the opening and is in sealed contact with the inner wall of the cavity, and the adjusting rod is driven by the drive part to drive the piston to move in the cavity; or the pressure adjusting mechanism is a sealed air chamber, the sealed air chamber is internally provided with a piston, the piston is in sealed contact with the inner wall of the sealed air chamber, a drive part is arranged outside the sealed air chamber, and the drive part electromagnetically pushes the piston to move in the cavity; or, the pressure adjusting mechanism is an airbag of which one end is connected with a drive part, the airbag has volume changes under the driving of the drive part, and the airbag is communicated with the gas path of the gas density relay; or the pressure adjusting mechanism is a bellow, one end of the bellow is communicated with the gas path of the gas density relay, and the other end of the bellow extends and withdraws under the driving of the drive part; or the pressure adjusting mechanism is a deflation valve, and the deflation valve is a solenoid valve or a valve with electrically motorized operation; or the pressure adjusting mechanism is a compressor; or the pressure adjusting mechanism is a pump, and the pump comprises one of a pressure pump, a booster pump, an electric air pump and an electromagnetic gas pump;

the drive part comprises one of a magnetic, motor and reciprocating mechanism, a Carnot cycle mechanism and a pneumatically operated element.

7. The gas density relay check device according to claim 1, wherein the contact signal sampling unit meets the following when sampling contact signals of the checked gas density relay: the contact signal sampling unit has at least one independent group of sampling contacts, is capable of simultaneously automatically checking at least one contact, and measures consecutively without changing contacts or reselecting contacts; the contacts comprise, but not limited to one of an alarm contact, an alarm contact+locking contact, an alarm contact+locking 1 contact+locking 2 contact, and alarm contact+locking contact+overpressure contact.

8. The gas density relay check device according to claim 1, wherein the computer data processing system carries out data processing according to whether the checked gas density relay is an absolute pressure relay or a relative pressure relay, whether a sensor for measurement is an absolute pressure sensor or a relative pressure sensor, a temperature value in test and a pressure-temperature property relationship of a gas, to obtain a corresponding 20° C. pressure value, and achieve accurate test on the performance of the gas density relay; and data processing contents of the computer data processing system comprise:

1) When the absolute pressure relay is measured with the absolute pressure sensor, a measured absolute pressure value is directly converted into a corresponding 20° C. absolute pressure value according to the temperature value in test and the pressure-temperature property relationship of the gas;

2) When the relative pressure relay is measured with the relative pressure sensor, a measured relative pressure value is directly converted into a corresponding 20° C. relative pressure value according to the temperature value in test and the pressure-temperature property relationship of the gas;

3) When the relative pressure relay is measured with the absolute pressure sensor, the measured absolute pressure value is first converted into a relative pressure value, in a conversion relational expression: P measured relative pressure=P measured absolute pressure–Plocal atmospheric pressure, and is converted into a corresponding 20° C. relative pressure value according to the temperature value in test and the pressure-temperature property relationship of the gas;

4) When the absolute pressure relay is measured with the relative pressure sensor, a measured relative pressure value is first converted into the absolute pressure value, in a conversion relational expression: P measured absolute pressure=P measured relative pressure+Plocal atmospheric pressure, and is converted into the corresponding 20° C. absolute pressure value according to the temperature value in test and the pressure-temperature property relationship of the gas.

9. The gas density relay check device according to claim 8, wherein the data processing contents of the computer data processing system also comprise:

when the relative pressure relay is measured with the absolute pressure sensor, the measured absolute pressure value is first converted into the corresponding 20° C. absolute pressure value according to the temperature value in test and the pressure-temperature property relationship of the gas, and is converted into the corresponding 20° C. relative pressure value, in a conversion relational expression: P20 measured relative pressure=P20 measured absolute pressure-Plocal atmospheric pressure;

when the absolute pressure relay is measured with the relative pressure sensor, the measured relative pressure value is first converted into the corresponding 20° C. relative pressure value according to the temperature value in test and the pressure-temperature property relationship of the gas, and is converted into the corresponding 20° C. absolute pressure value, in a conversion relational expression: P20 measured absolute pressure=P20 measured relative pressure+Plocal atmospheric pressure.

10. A check method of a gas density relay check device, wherein the gas density relay check device comprises a temperature adjusting mechanism, at least one pressure sensor, at least one temperature sensor, a computer data processing system, a contact signal sampling unit and a gas source providing mechanism; the check method comprises:

in check, relatively setting the temperature adjusting mechanism and a checked gas density relay;

connecting the contact signal sampling unit with a contact of the gas density relay;

communicating the gas source providing mechanism with the gas density relay on a gas path; operating or controlling the gas source providing mechanism manually or through the computer data processing system, to provide a gas of set pressure for the gas density relay, and charge the gas density relay with the gas of the set pressure;

operating or controlling the temperature adjusting mechanism manually or through the computer data processing system, to rise the temperature of the gas density relay, then rise the temperature of a temperature compensation element of the gas density relay, and enable the gas density relay to have a contact action, the contact action is transmitted to the computer data processing system through the contact signal sampling unit, and the computer data processing system obtains a gas density value according to a pressure value and a temperature value in the contact action, or directly obtains the gas density value, and detects a contact signal operating value of the gas density relay, to complete check on the contact signal operating value of the gas density relay; and after all contact signal check is completed, powering off a heating element of the temperature adjusting mechanism manually or through the computer data processing system.

11. The check method of the gas density relay check device according to claim 10, comprising:

in check, relatively setting the temperature adjusting mechanism and a checked gas density relay;

connecting the contact signal sampling unit with a contact of the gas density relay;

communicating the gas source providing mechanism with the gas density relay on a gas path; operating or controlling the gas source providing mechanism manually or through the computer data processing system, to provide a gas of set pressure for the gas density relay, and charge the gas density relay with the gas of the set pressure;

operating or controlling the temperature adjusting mechanism manually or through the computer data processing system, to rise the temperature of the gas density relay, then rise the temperature of a temperature compensation element of the gas density relay, and enable the gas density relay to have a contact action, the contact action is transmitted to the computer data processing system through the contact signal sampling unit, and the computer data processing system obtains a gas density value according to a pressure value and a temperature value in the contact action, or directly obtains the gas density value, and detects a contact signal operating value of the gas density relay, to complete check on the contact signal operating value of the gas density relay; and operating or controlling the temperature adjusting mechanism manually or through the computer data processing system, to reduce the temperature of the gas density relay, then reduce the temperature of the temperature compensation element of the gas density relay, and enable the gas density relay to have contact reset, the contact reset is transmitted to the computer data processing system through the contact signal sampling unit, and the computer data processing system obtains the gas density value according to the pressure value and the temperature value in the contact reset, or directly obtains the gas density value, and detects a contact signal return value of the gas density relay, to complete check on the contact signal return value of the gas density relay; and after all contact signal check is completed, powering off the heating element of the temperature adjusting mechanism manually or through the computer data processing system.

12. The check method of the gas density relay check device according to claim 10, wherein the gas density relay check device also comprises a pressure adjusting mechanism, the gas path of the pressure adjusting mechanism is communicated with the gas path of the checked gas density relay; and the check method of the gas density relay check device also comprises:

in check, relatively setting the temperature adjusting mechanism and a checked gas density relay;

connecting the contact signal sampling unit with a contact of the gas density relay;

communicating the gas source providing mechanism with the gas density relay on a gas path; operating or controlling the gas source providing mechanism manually or through the computer data processing system, to provide a gas of set pressure for the gas density relay, and charge the gas density relay with the gas of the set pressure;

driving the pressure adjusting mechanism manually or through the computer data processing system, to slowly reduce the pressure of the gas, and operating or controlling the temperature adjusting mechanism manually or through the computer data processing system, to rise the temperature of the gas density relay, then rise the temperature of the temperature compensation element of the gas density relay, and enable the gas density relay to have the contact action, the contact action is transmitted to the computer data processing system through the contact signal sampling unit, and the computer data processing system obtains the gas density value according to a pressure value and a temperature value in the contact action, or directly obtains the gas density value, and detects the contact signal operating value of the gas density relay, to complete check on the contact signal operating value of the gas density relay;

after all contact signal check is completed, powering off the heating element of the temperature adjusting mechanism manually or through the computer data processing system.

13. The check method of the gas density relay check device according to claim 10, wherein the gas density relay check device also comprises a pressure adjusting mechanism, the gas path of the pressure adjusting mechanism is communicated with the gas path of the checked gas density relay; and the check method of the gas density relay check device also comprises:

in check, relatively setting the temperature adjusting mechanism and a checked gas density relay;

connecting the contact signal sampling unit with a contact of the gas density relay;

communicating the gas source providing mechanism with the gas density relay on a gas path; operating or controlling the gas source providing mechanism manually or through the computer data processing system, to provide a gas of set pressure for the gas density relay, and charge the gas density relay with the gas of the set pressure;

operating or controlling the temperature adjusting mechanism manually or through the computer data processing system, to rise the temperature of the gas density relay, then rise the temperature of the temperature compensation element of the gas density relay, and driving the pressure adjusting mechanism manually or through the computer data processing system, to slowly reduce the pressure of the gas, and enable the gas density relay to have the contact action, the contact action is transmitted to the computer data processing system through the contact signal sampling unit, and the computer data processing system obtains the gas density value according to the pressure value and the temperature value in the contact action, or directly obtains the gas density value, and detects the contact signal operating value of the gas density relay, to complete check on the contact signal operating value of the gas density relay;

operating or controlling the temperature adjusting mechanism manually or through the computer data processing system, to reduce the temperature of the gas density relay, then reduce the temperature of the temperature compensation element of the gas density relay, and driving the pressure adjusting mechanism manually or through the computer data processing system, to slowly rise the pressure of the gas, and enable the gas density relay to have contact reset, the contact reset is transmitted to the computer data processing system through the contact signal sampling unit, and the computer data processing system obtains the gas density value according to the pressure value and the temperature value in the contact reset, or directly obtains the gas density value, and detects the contact signal return value of the gas density relay, to complete check on the contact signal return value of the gas density relay;

after all contact signal check is completed, powering off the heating element of the temperature adjusting mechanism manually or through the computer data processing system.

14. A check method of a gas density relay check device, comprising:

in check, relatively setting the temperature adjusting mechanism and a checked gas density relay;

connecting the contact signal sampling unit with a contact of the gas density relay;

communicating a pressure sensor with the gas density relay on a gas path;

operating or controlling the temperature adjusting mechanism manually or through the computer data processing system, to rise the temperature of the gas density relay, then rise the temperature of a temperature compensation element of the gas density relay, and enable the gas density relay to have a contact action, the contact action is transmitted to the computer data processing system through the contact signal sampling unit, and the computer data processing system obtains a gas density value according to a pressure value and a temperature value in the contact action, or directly obtains the gas density value, and detects a contact signal operating value of the gas density relay, to complete check on the contact signal operating value of the gas density relay; and after all contact signal check is completed, powering off a heating element of the temperature adjusting mechanism manually or through the computer data processing system.

15. The check method of the gas density relay check device according to claim 14, comprising:

in check, relatively setting the temperature adjusting mechanism and a checked gas density relay;

connecting the contact signal sampling unit with a contact of the gas density relay;

communicating a pressure sensor with the gas density relay on a gas path;

operating or controlling the temperature adjusting mechanism manually or through the computer data processing system, to rise the temperature of the gas density relay, then rise the temperature of a temperature compensation element of the gas density relay, and enable the gas density relay to have a contact action, the contact action is transmitted to the computer data processing system through the contact signal sampling unit, and the computer data processing system obtains a gas density value according to a pressure value and a temperature value in the contact action, or directly obtains the gas density value, and detects a contact signal operating value of the gas density relay, to complete check on the contact signal operating value of the gas density relay; and operating or controlling the temperature adjusting mechanism manually or through the computer data processing system, to reduce the temperature of the gas density relay, then reduce the temperature of the temperature compensation element of the gas density relay, and enable the gas density relay to have contact reset, the contact reset is transmitted to the computer data processing system through the contact signal sampling unit, and the computer data processing system obtains the gas density value according to the pressure value and the temperature value in the contact reset, or directly obtains the gas density value, and detects a contact signal return value of the gas density relay, to complete check on the contact signal return value of the gas density relay; and after all contact signal check is completed, powering off the heating element of the temperature adjusting mechanism manually or through the computer data processing system.

16. The check method of the gas density relay check device according to claim 14, wherein the gas density relay check device also comprises a pressure adjusting mechanism, the gas path of the pressure adjusting mechanism is communicated with the gas path of the checked gas density relay; and the check method of the gas density relay check device also comprises:

in check, relatively setting the temperature adjusting mechanism and a checked gas density relay;

connecting the contact signal sampling unit with a contact signal of the gas density relay;

communicating a pressure sensor with the gas density relay on a gas path;

closing a valve between the gas density relay and electrical equipment;

driving the pressure adjusting mechanism manually or through the computer data processing system, to slowly reduce the pressure of the gas, and operating or controlling the temperature adjusting mechanism manually or through the computer data processing system, to rise the temperature of the gas density relay, then rise the temperature of the temperature compensation element of the gas density relay, and enable the gas density relay to have the contact action, the contact action is transmitted to the computer data processing system through the contact signal sampling unit, and the computer data processing system obtains the gas density value according to a pressure value and a temperature value in the contact action, or directly obtains the gas density value, and detects the contact signal operating value of the gas density relay, to complete check on the contact signal operating value of the gas density relay;

after all contact signal check is completed, powering off the heating element of the temperature adjusting mechanism manually or through the computer data processing system.

17. The check method of the gas density relay check device according to claim 14, wherein the gas density relay check device also comprises a pressure adjusting mechanism, the gas path of the pressure adjusting mechanism is communicated with the gas path of the checked gas density relay; and the check method of the gas density relay check device also comprises:

in check, relatively setting the temperature adjusting mechanism and a checked gas density relay;

connecting the contact signal sampling unit with a contact of the gas density relay;

communicating a pressure sensor with the gas density relay on a gas path;

closing a valve between the gas density relay and electrical equipment;

operating or controlling the temperature adjusting mechanism manually or through the computer data processing system, to rise the temperature of the gas density relay, then rise the temperature of the temperature compensation element of the gas density relay, and driving the pressure adjusting mechanism manually or through the computer data processing system, to slowly reduce the pressure of the gas, and enable the gas density relay to have the contact action, the contact action is transmitted to the computer data processing system through the contact signal sampling unit, and the computer data processing system obtains the gas density value according to the pressure value and the temperature value in the contact action, or directly obtains the gas density value, and detects the contact signal operating value of the gas density relay, to complete check on the contact signal operating value of the gas density relay;

operating or controlling the temperature adjusting mechanism manually or through the computer data processing system, to reduce the temperature of the gas density relay, then reduce the temperature of the temperature compensation element of the gas density relay, and driving the pressure adjusting mechanism manually or through the computer data processing system, to slowly rise the pressure of the gas, and enable the gas density relay to have contact reset, the contact reset is transmitted to the computer data processing system through the contact signal sampling unit, and the computer data processing system obtains the gas density value according to the pressure value and the temperature value in the contact reset, or directly obtains the gas density value, and detects the contact signal return value of the gas density relay, to complete check on the contact signal return value of the gas density relay;

after all contact signal check is completed, powering off the heating element of the temperature adjusting mechanism manually or through the computer data processing system.

* * * * *